United States Patent
Fritz

(10) Patent No.: US 10,872,913 B2
(45) Date of Patent: Dec. 22, 2020

(54) CMOS PIXEL, IMAGE SENSOR, AND CAMERA AND METHOD FOR READING OUT A CMOS PIXEL

(71) Applicant: Robert Bosch GmbH, Stuttgart (DE)

(72) Inventor: Steffen Fritz, Wurmberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/316,937

(22) PCT Filed: Jul. 10, 2017

(86) PCT No.: PCT/EP2017/067216
§ 371 (c)(1),
(2) Date: Jan. 10, 2019

(87) PCT Pub. No.: WO2018/011121
PCT Pub. Date: Jan. 18, 2018

(65) Prior Publication Data
US 2019/0296059 A1    Sep. 26, 2019

(30) Foreign Application Priority Data
Jul. 13, 2016  (DE) .......................... 10 2016 212 784

(51) Int. Cl.
*H01L 27/146* (2006.01)
*G02B 5/02* (2006.01)
(Continued)

(52) U.S. Cl.
CPC ........ *H01L 27/1461* (2013.01); *G02B 5/0205* (2013.01); *H04N 5/3559* (2013.01);
(Continued)

(58) Field of Classification Search
CPC .................................................. H01L 27/1461
See application file for complete search history.

(56) References Cited

U.S. PATENT DOCUMENTS 9,942,503 B2 * 4/2018 Velichko ........... H01L 27/14609
10,536,652 B2 * 1/2020 Oh .................... H01L 27/14609
(Continued)

FOREIGN PATENT DOCUMENTS

| JP | 2012049904 A | 3/2012 |
| JP | 2013033896 A | 2/2013 |
| WO | 2008133861 A1 | 11/2008 |

OTHER PUBLICATIONS

International Search Report for PCT/EP2017/067216, dated Sep. 8, 2017.

*Primary Examiner* — Eugene Lee
(74) *Attorney, Agent, or Firm* — Norton Rose Fulbright US LLP; Gerard Messina

(57) ABSTRACT

CMOS pixel having a dual conversion gain readout circuit, including at least one first photodiode (PD1), a diffusion region (FD) having a first capacitance (CFD) for accommodating a charge of the at least one first photodiode (PD1), the dual conversion gain readout circuit being designed to read out the charge of the diffusion region (FD) with the aid of a first amplification factor and with the aid of a second amplification factor, the CMOS pixel including at least one second photodiode (PD2), the diffusion region (FD) furthermore being designed to accommodate a charge of the at least one second photodiode (PD2), and the dual conversion gain readout circuit being designed to read out the charge of the diffusion region (FD) with the aid of at least one third amplification factor and at least one fourth amplification factor.

20 Claims, 3 Drawing Sheets

(51) Int. Cl.
  *H04N 5/355* (2011.01)
  *H04N 5/378* (2011.01)
  *H04N 5/3745* (2011.01)
(52) U.S. Cl.
  CPC ......... *H04N 5/35563* (2013.01); *H04N 5/378* (2013.01); *H04N 5/37452* (2013.01); *H04N 5/37457* (2013.01)

(56) References Cited

U.S. PATENT DOCUMENTS

| | | |
|---|---|---|
| 2004/0251394 A1 | 12/2004 | Rhodes et al. |
| 2006/0208161 A1* | 9/2006 | Okita ................. H04N 5/37457 250/208.1 |
| 2009/0295973 A1* | 12/2009 | Oshikubo .......... H04N 5/37457 348/311 |
| 2011/0140182 A1 | 6/2011 | Tanaka |
| 2013/0256510 A1 | 10/2013 | Lyu |
| 2015/0054973 A1* | 2/2015 | Velichko ............ H04N 5/37452 348/218.1 |
| 2016/0133659 A1* | 5/2016 | Chao ................. H01L 27/14605 257/231 |
| 2016/0255289 A1* | 9/2016 | Johnson ............... H04N 5/3559 348/273 |
| 2017/0040360 A1* | 2/2017 | Iizuka ............... H01L 27/14605 |
| 2017/0230593 A1* | 8/2017 | Johnson ................. H04N 5/243 |
| 2017/0324917 A1* | 11/2017 | Mlinar ................... H04N 9/045 |

* cited by examiner

CMOS PIXEL, IMAGE SENSOR, AND CAMERA AND METHOD FOR READING OUT A CMOS PIXEL

FIELD OF THE INVENTION

The present invention relates to a CMOS pixel, an image sensor, and a camera and a method for reading out a CMOS pixel.

BACKGROUND INFORMATION

CMOS image sensors are produced using different pixel designs. Designs having four to six transistors per pixel and one or two photodiodes are typical.

Designs having four transistors and a pinned photodiode are known. Pinned in this context means that the photodiode is manufactured by the silicon process in such a way that the photodiode does not have a connection to a metal.

Furthermore, designs having five transistors, a pinned photodiode, and a dual conversion gain readout circuit are known. A dual conversion gain readout circuit is to be understood in the present case as a circuit which is designed to read out the charge of the photodiode with the aid of at least two different amplification factors, to ascertain the electromagnetic radiation detected by the photodiode, typically in the wavelength range of light, including the ultraviolet and infrared wavelength ranges.

Furthermore, designs having five transistors and two pinned photodiodes are known.

Furthermore, designs having six transistors are known. These are typically used to implement an image sensor including global shutter.

The challenge in pixel design is to design a circuit which manages with preferably few transistors and nonetheless meets the demands on the performance.

The requirement of using preferably few transistors originates from the fact that both the photodiodes and the transistors are housed on the same carrier or substrate, so the more area which is occupied by transistors, the lower the light yield of the photodiode is. The light sensitivity and the dark sensitivity of the pixel are reduced accordingly.

To achieve preferably high dynamics, either more than one photodiode, typically two photodiodes, are used or a dual conversion gain readout circuit is used.

For color sensors, the number of the transistors may be reduced on average to three with the aid of multiple usage of the transistors (transistor sharing) in a cluster having four pixels (for example, according to the Bayer pattern, i.e., red, green, blue, green).

A CMOS pixel according to the definition of the species of the present invention is known from US 2004/0251394 A1.

SUMMARY

Against this background, in the present case a CMOS pixel is described having a dual conversion gain readout circuit, including at least one first photodiode, a diffusion region having a first capacitance for accommodating a charge of the at least one first photodiode, the dual conversion gain readout circuit being designed to read out the charge of the diffusion region with the aid of a first amplification factor and with the aid of a second amplification factor, the CMOS pixel having at least one second photodiode, the diffusion region furthermore being designed to accommodate a charge of the at least one second photodiode, and the dual conversion gain readout circuit being designed to read out the charge of the diffusion region with the aid of at least one third amplification factor and at least one fourth amplification factor.

In the pixel of the present invention, a split pixel, i.e., a pixel having more than one photodiode, typically having two photodiodes, is combined with a dual conversion gain readout circuit.

The advantage of the pixel of the present invention is that a pixel having a high dynamic range (>140 dB), on the one hand, and a good dark sensitivity is created.

A high dynamic range is necessary, for example, if an image is to be recorded which has a great dark portion and a great light portion. A typical situation in which such an image is to be recorded is when entering a tunnel in bright daylight.

In one specific embodiment of the pixel of the present invention, the dual conversion gain readout circuit of the CMOS pixel includes a dual conversion gain capacitance, the dual conversion gain readout circuit being designed to form the second amplification factor with the aid of the dual conversion gain capacitance.

The dual conversion gain capacitance is typically provided by a dual conversion gain capacitor.

In one advantageous specific embodiment of the CMOS pixel, the at least one first photodiode and the at least one second photodiode have different sizes.

A different sensitivity is obtained due to the different sizes of the photodiodes. An increased dynamic range is obtained by the combination of the signals of the two photodiodes.

In one variant of this specific embodiment, the at least one first photodiode is smaller than the at least one second photodiode.

The dynamic range is all the greater if the size or area difference of the photodiodes is preferably large.

In one concrete embodiment, a size or area ratio between the at least one first photodiode and the at least one second photodiode of 1:8 has proven to be advantageous.

In one specific embodiment of the pixel, the at least one first photodiode has a first photodiode capacitance and the at least one second photodiode has a second photodiode capacitance, the first photodiode capacitance being less than the second photodiode capacitance.

In one concrete embodiment, it has proven to be advantageous for the first photodiode capacitance to have a capacitance of 5000 $e^-$ (electrons) and the second photodiode capacitance to have a capacitance of 10,000 $e^-$ (electrons).

In one specific embodiment of the pixel, a switch, in particular a transistor, is situated between the diffusion region and the first capacitor.

In one advantageous specific embodiment, the dual conversion gain readout circuit is designed for the first photodiode capacitance of the at least one first photodiode.

Because the at least one first photodiode and the at least one second photodiode have different sizes or areas, the photodiodes also have different photodiode capacitances. Because the dynamic range of the pixel is all the better the larger the size or area difference of the at least one first photodiode is from the at least one second photodiode, the difference of the photodiode capacitances being accordingly large. This would have the result that readout circuits designed for the particular photodiode capacitances of the photodiodes would have to be provided for reading out the photodiodes with the aid of the dual conversion gain readout circuit.

The advantage results due to the design of the dual conversion gain readout circuit for the smaller of the two photodiode capacitances that the same dual conversion gain readout circuit may also be used for the larger of the two photodiode capacitances.

The number of the transistors may thus be reduced for the individual pixel and as a result thereof more area of the pixel may be provided for the at least one first photodiode and the at least one second photodiode. The dark sensitivity of the pixel is thus enhanced.

In one advantageous specific embodiment of the pixel, the at least one first photodiode is designed to provide the first photodiode capacitance of the dual conversion gain readout circuit and the dual conversion gain readout circuit is designed to form the at least one third amplification factor with the aid of the first capacitance or the first capacitance and the first photodiode capacitance and to form the at least one fourth amplification factor with the aid of the first capacitance and the second capacitance or the first capacitance and the second capacitance and the first photodiode capacitance.

In one advantageous variant of this specific embodiment, the first photodiode is designed in such a way that the first photodiode capacitance and the first capacitance are suitable so that the dual conversion gain readout circuit is designed for the at least one second photodiode.

To achieve a maximum between size or area ratio and photodiode capacitance ratio between the at least one first photodiode and the at least one second photodiode, the silicon process for manufacturing the at least one first photodiode is set in such a way that the doping of the at least one first photodiode results in a preferably high or the desired photodiode capacitance of the first photodiode.

This variant offers the advantage that although only one shared dual conversion gain readout circuit is provided for the at least one first photodiode and also the at least one second photodiode, a readout optimally designed for both photodiodes or photodiode capacitances may nonetheless be achieved.

In one specific embodiment of the pixel, a second switch, in particular a transistor, is situated between the at least one first photodiode and the diffusion region.

A further aspect of the present invention is a method for reading out a CMOS pixel according to the present invention including the following steps:
 reading out the charge of the at least one first photodiode from the diffusion region with the aid of a first amplification factor;
 reading out the charge of the at least one first photodiode from the diffusion region with aid of a second amplification factor;
 resetting the dual conversion gain readout circuit and the first photodiode;
 reading out the charge of the at least one second photodiode from the diffusion region with the aid of a third amplification factor;
 reading out the charge of the at least one second photodiode from the diffusion region with the aid of a fourth amplification factor.

This aspect of the present invention results from the finding that the particular amplification factor results from the ratio between the photodiode capacitance to be read out and the capacitance with the aid of which the dual conversion gain readout circuit reads out the photodiode.

Accordingly, a different amplification factor also results if the dual conversion gain readout circuit does use the same capacitance or the same capacitances, but the photodiode to be read out has a different photodiode capacitance in relation thereto.

In one specific embodiment of the method, in the step of reading out with the aid of the second amplification factor, the first capacitance and second capacitance are used for the reading out.

This specific embodiment provides a second amplification factor for reading out the first photodiode by adding the second capacitance of the dual conversion gain circuit.

In one specific embodiment of the method, in the step of reading out with the aid of the third amplification factor, the first capacitance or the first capacitance and the first photodiode capacitance is/are used for the reading out.

In another specific embodiment of the method, in the step of reading out with aid of the fourth amplification factor, the first capacitance and second capacitance or the first capacitance and second capacitance and the first photodiode capacitance are used for the reading out.

If the at least one second photodiode is read out using the dual conversion gain readout circuit, which is designed for the at least one first photodiode, this results in a particularly strong amplification factor. Particularly faint objects may thus also be detected via the pixel.

By adding the photodiode capacitance of the at least one first photodiode, the readout circuit is detuned in such a way that the dual conversion gain readout circuit, which is designed for the at least one first photodiode is then designed for the at least one second photodiode. This specific embodiment is based on the finding that the at least one first photodiode may provide its photodiode capacitance to the dual conversion gain readout circuit in order to create a ratio between the photodiode capacitance of the at least one second photodiode and the dual conversion gain readout circuit which is optimal for the readout of the second photodiode.

A particularly good result is achieved if the photodiode capacitance of the at least one first photodiode is selected in such a way that, in cooperation with the dual conversion gain readout circuit, a capacitance results on the part of the readout circuit which is optimal for the readout of the at least one second photodiode capacitance.

DETAILED DESCRIPTION

Figure 1:
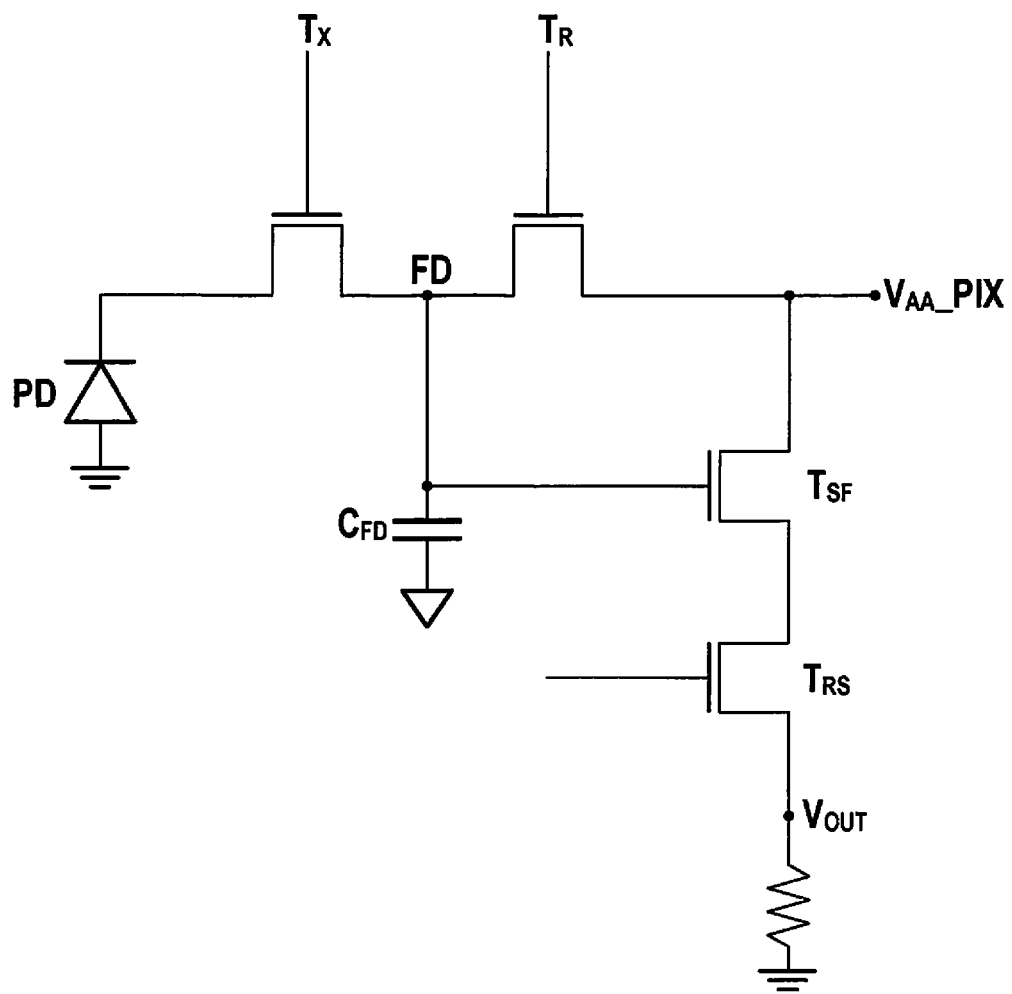
FIG. 1 shows a CMOS pixel including four transistors without a dual conversion gain readout circuit according to the related art.

FIG. 1 shows a CMOS pixel including four transistors according to the related art. The CMOS pixel includes a photodiode PD and a diffusion region FD including an associated capacitance CFD. A transistor is situated as a transfer gate $T_x$ between diffusion region FD and photodiode PD. The charge of photodiode PD is transferred for the readout to diffusion region FD via transfer gate $T_x$. A transistor is situated as a reset transistor $T_R$ between diffusion region FD and voltage supply $V_{AA\_PIX}$ of the pixel in order to reset the pixel. Two transistors are situated between voltage supply $V_{AA\_PIX}$ and ground as source follower transistor $T_{SF}$ for amplification and as row select transistor $T_{RS}$ for selecting the pixel row to be read out, for example, in rolling shutter operation of a CMOS image sensor made up of CMOS pixels.

The electromagnetic radiation detected via the pixel, typically light from the ultraviolet to the infrared range, may be read out as a variable represented by a voltage value via voltage point $V_{out}$.

The electromagnetic radiation thus detected is supplied to a postprocessing unit, typically to a digitization circuit and a subsequent processing for providing a piece of image information.

Figure 2:
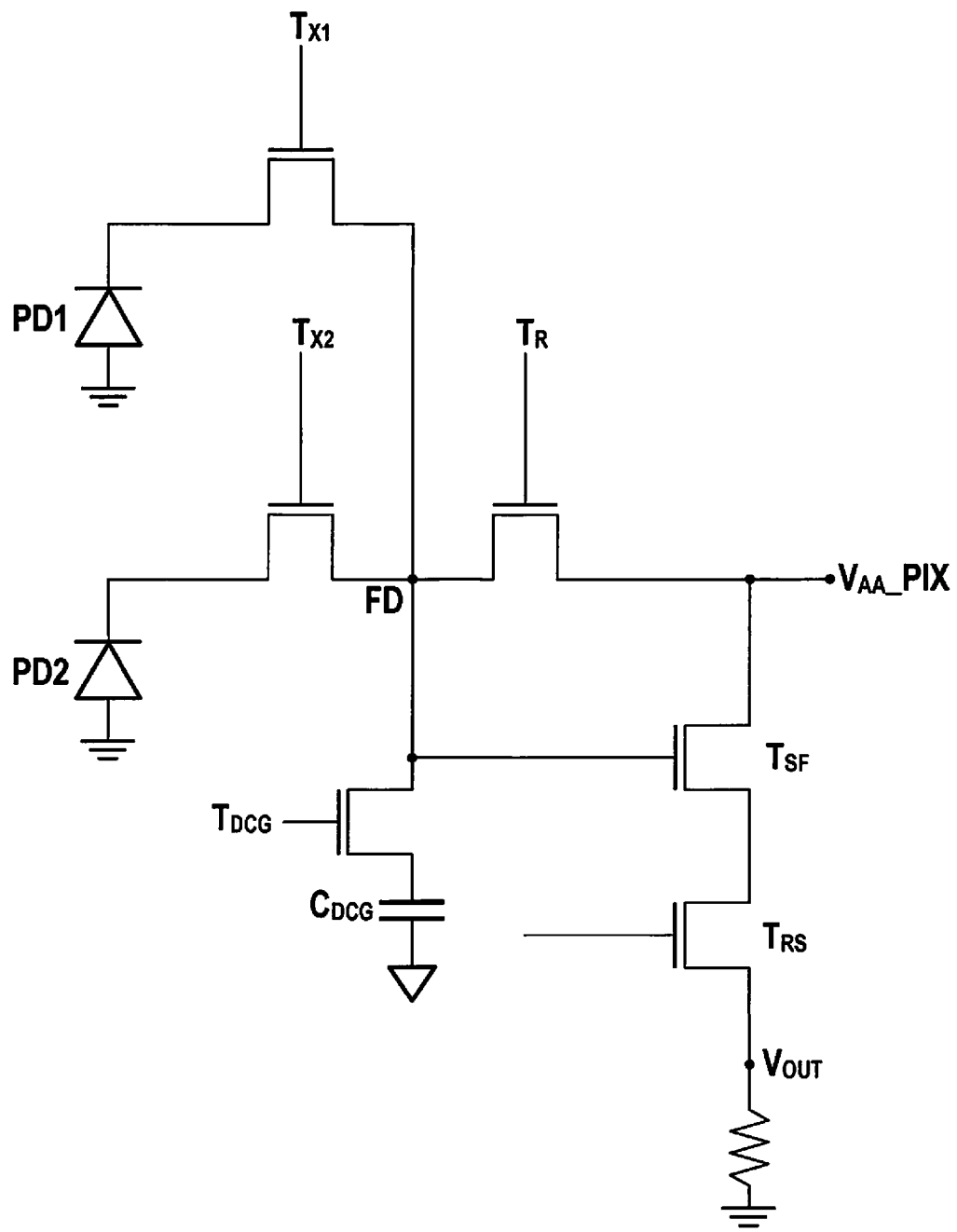
FIG. 2 shows a CMOS pixel including a dual conversion gain readout circuit according to the present invention.

FIG. 2 shows a CMOS pixel including a dual conversion gain readout circuit according to the present invention. Identical or identically-acting elements are provided with identical or similar reference numerals. The illustrated pixel includes a first photodiode PD1 and a second photodiode PD2. The two photodiodes PD1, PD2 are associated with a shared diffusion region FD. A particular transfer gate transistor $T_{x1}$, $T_{x2}$ is associated with each photodiode PD1, PD2. Photodiodes PD1, PD2 or the photodiode capacitances are connectable to diffusion region FD via transfer gate transistors $T_{x1}$, $T_{x2}$.

Capacitance $C_{FD}$ of diffusion region FD is not shown in FIG. 2, but is present nevertheless.

In addition to the elements already described in FIG. 1, the illustrated pixel includes a dual conversion gain readout circuit, which forms at least one first amplification factor and one second amplification factor. The dual conversion gain readout circuit includes a transistor as dual conversion gain transistor $T_{DCG}$, which is situated between diffusion region FD and capacitance $C_{DCG}$, which is also associated with the dual conversion gain readout circuit. Dual conversion gain capacitance $C_{DCG}$ is provided in the illustrated CMOS pixel as a capacitor, which is situated between dual conversion gain transistor $T_{DCG}$ and ground.

The capacitances of the dual conversion gain readout circuit and the two photodiodes PD1, PD2, which are designed in relation to one another, are not shown in FIG. 2 but are associated with the illustrated specific embodiment of the CMOS pixel according to the present invention.

According to one specific embodiment, the size or the area of first photodiode PD1 is smaller by a ratio 1:8 than the size or the area of second photodiode PD2. First photodiode PD1 accordingly has a lower photodiode capacitance. By way of a corresponding adaptation of the silicon process for manufacturing photodiodes PD1, PD2 it may be achieved that the photodiode capacitance of first photodiode PD1 is 5000 e⁻ (electrons) and the photodiode capacitance of second photodiode PD2 is 10,000 e⁻, i.e., the ratio of the photodiode capacitances is 1:2. The dual conversion gain readout circuit is designed for the photodiode capacitance of first photodiode PD1 and provides a strong amplification factor (high conversion gain) and a weak amplification factor (low conversion gain) for the readout of the charge of first photodiode PD1.

Since the dual conversion gain readout circuit is designed for the first photodiode, the amplification factors are not necessarily optimal for the readout of the second photodiode.

The present invention is based on the optimized photodiode capacitance of first photodiode PD1 being able to be used by the dual conversion gain readout circuit to read out second photodiode PD2.

For this purpose, after the readout of first photodiode PD1, photodiode PD1 is reset via reset transistor $T_R$. However, for the readout of second photodiode PD2, transfer gate $T_{x1}$ of the first photodiode is not closed, i.e., it is not set to nonconductive, but rather still remains open, i.e., set to conductive.

This is possible, inter alia, because in comparison to the exposure time of the photodiodes, the resulting readout procedure is very short and therefore the exposure of first photodiode PD1 during the readout of second photodiode PD2 does not have a negative or corrupting effect. This is also assisted by the maximized size difference between first photodiode PD1 and second photodiode PD2.

By way of the CMOS pixel of the illustrated specific embodiment, it is possible to detune the dual conversion gain readout circuit by a factor of 2 to read out second photodiode PD2 with the aid of the photodiode capacitance of first photodiode PD1, in order to design the dual conversion gain readout circuit for second photodiode PD2.

The size or area ratios and capacitance ratios indicated above are one possible specific embodiment of the CMOS pixel according to the present invention. Other size or area ratios and capacitance ratios are possible depending on the area of application.

It is additionally also possible and possibly even desirable for the photodiode capacitance of first photodiode PD1 not to be taken into consideration during the readout of second photodiode PD2. The dual conversion gain readout circuit designed for first photodiode PD1 is used to read out second photodiode PD2. This results in extreme amplification factors, which may be referred to as ultralow and ultrahigh conversion gains.

Figure 3:
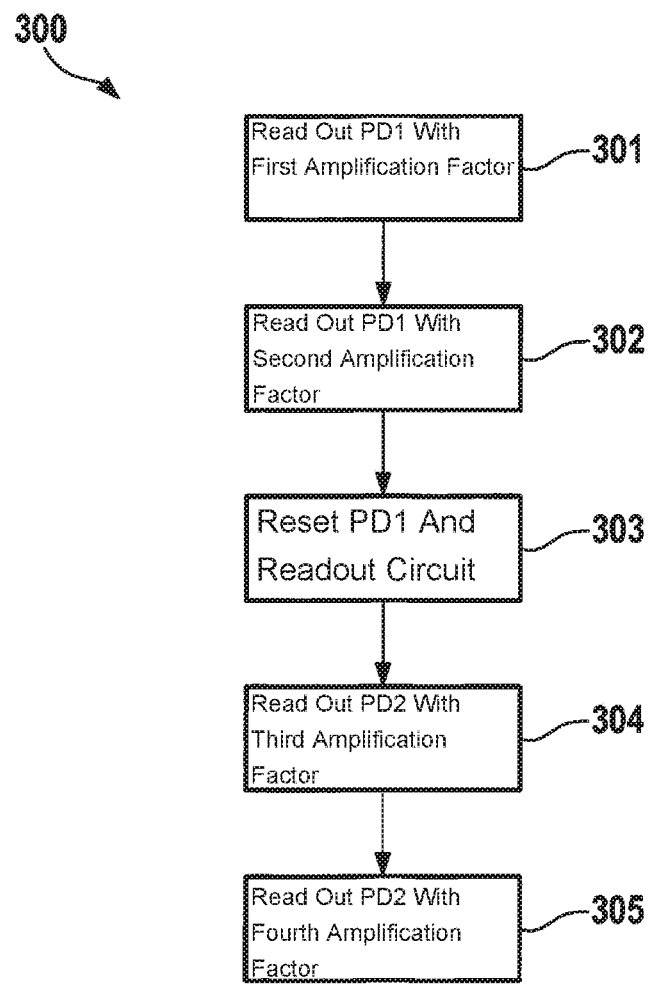
FIG. 3 shows a flow chart of a method for reading out a CMOS pixel according to the present invention.

FIG. 3 shows a flowchart of a method for reading out a CMOS pixel according to the present invention.

In step 301, first photodiode PD1 is read out using a first amplification factor. For this purpose, with reference to FIG. 2, reset transistor $T_R$, dual conversion gain transistor $T_{DCG}$, and transfer gate transistor $T_{x2}$ of the second photodiode may be closed. Transfer gate transistor $T_{x1}$ of the first photodiode is accordingly open.

In step 302, first photodiode PD1 is read out using a second amplification factor. For this purpose, with reference to FIG. 2, reset transistor $T_R$ and transfer gate transistor $T_{x2}$ of the second photodiode may be closed. Transfer gate transistor $T_{x1}$ of the first photodiode and dual conversion gain transistor $T_{DCG}$ are accordingly open.

In step 303, first photodiode PD1 and the dual conversion gain readout circuit are reset. For this purpose, reset transistor $T_R$, dual conversion gain transistor $T_{DCG}$, and transfer gate transistor $T_{x1}$ of first photodiode PD1 are open. Transfer gate transistor $T_{x2}$ of second photodiode PD2 is closed.

In step 304, second photodiode PD2 is read out using a third amplification factor. For this purpose, with reference to FIG. 2, reset transistor $T_R$ and dual conversion gain transistor $T_{DCG}$ may be closed. Transfer gate transistors $T_{x1}$, $T_{x2}$ of first and second photodiodes PD1, PD2 are accordingly open. A strong amplification factor (high conversion gain) is thus achieved for the readout of second photodiode PD2. Alternatively, transfer gate transistor $T_{x1}$ of first photodiode PD1 may also be closed. An extremely strong amplification factor (ultrahigh conversion gain) is thus achieved.

In step 305, second photodiode PD2 is read out using a fourth amplification factor. For this purpose, with reference to FIG. 2, the reset transistor may be closed. Transfer gate transistor $T_{x1}$ of the first photodiode and transfer gate transistor $T_{x2}$ of the second photodiode and dual conversion gain transistor $T_{DCG}$ are accordingly open. An extremely weak amplification factor (ultralow conversion gain) is thus achieved for the readout of second photodiode PD2. Alternatively, transfer gate transistor $T_{x1}$ of first photodiode PD1 may also be closed. A weak amplification factor (low conversion gain) is thus achieved.

What is claimed is:

1. A CMOS pixel, comprising:
   a dual conversion gain readout circuit;
   at least one first photodiode;
   a diffusion region having a first capacitance for accommodating a charge of the at least one first photodiode, wherein the dual conversion gain readout circuit reads out the charge of the diffusion region with the aid of a first amplification factor and with a second amplification factor; and
   at least one second photodiode;
   wherein the diffusion region accommodates a charge of the at least one second photodiode,
   wherein the dual conversion gain readout circuit reads out the charge of the diffusion region with at least one third amplification factor and at least one fourth amplification factor, and
   wherein the dual conversion gain readout circuit is configured to form the at least one third amplification factor with: (i) the first capacitance, or (ii) the first capacitance and the first photodiode capacitance, and wherein the dual conversion gain readout circuit is configured to form the at least one fourth amplification factor with: (iii) the first capacitance and the second capacitance; or (iv) the first capacitance and the second capacitance and the first photodiode capacitance.

2. The CMOS pixel as recited in claim 1, wherein the dual conversion gain readout circuit includes a second capacitance, and the dual conversion gain readout circuit forms the second amplification factor with the aid of the second capacitance.

3. The CMOS pixel as recited in claim 2, wherein the second capacitance is a capacitor.

4. The CMOS pixel as recited in claim 3, further comprising:
   a switch situated between the diffusion region and the capacitor.

5. The CMOS pixel as recited in claim 4, wherein the switch i-s includes a transistor.

6. The CMOS pixel as recited in claim 1, wherein a size of the at least one first photodiode is different than a size of the at least one second photodiode.

7. The CMOS pixel as recited in claim 1, wherein the at least one first photodiode is smaller in size or area than the at least one second photodiode.

8. The CMOS pixel as recited in claim 1, wherein the at least one first photodiode has a first photodiode capacitance, and wherein the at least one second photodiode has a second photodiode capacitance, and the first photodiode capacitance is smaller than the second photodiode capacitance.

9. The CMOS pixel as recited in claim 8, wherein the dual conversion gain readout circuit uses the first photodiode capacitance of the at least one first photodiode.

10. The CMOS pixel as recited in claim 8, wherein the at least one first photodiode provides the first photodiode capacitance of the dual conversion gain readout circuit.

11. The CMOS pixel as recited in claim 10, wherein the first photodiode is formed so that the first photodiode capacitance and the first capacitance are suitable so that the dual conversion gain readout circuit is adapted for the at least one second photodiode.

12. The CMOS pixel as recited in claim 10, further comprising:
   a switch situated between the at least one first photodiode and the diffusion region.

13. The CMOS pixel as recited in claim 12, wherein the switch includes a transistor.

14. An image sensor, comprising:
   a CMOS pixel, including:
      a dual conversion gain readout circuit;
      at least one first photodiode;
      a diffusion region having a first capacitance for accommodating a charge of the at least one first photodiode, wherein the dual conversion gain readout circuit reads out the charge of the diffusion region with the aid of a first amplification factor and with a second amplification factor; and
      at least one second photodiode, wherein the diffusion region accommodates a charge of the at least one second photodiode, and wherein the dual conversion gain readout circuit reads out the charge of the diffusion region with the aid of at least one third amplification factor and at least one fourth amplification factor, and
      wherein the dual conversion gain readout circuit is configured to form the at least one third amplification factor with: (i) the first capacitance, or (ii) the first capacitance and the first photodiode capacitance, and wherein the dual conversion gain readout circuit is configured to form the at least one fourth amplification factor with: (iii) the first capacitance and the second capacitance; or (iv) the first capacitance and the second capacitance and the first photodiode capacitance.

15. A camera, comprising:
   an image sensor, including a CMOS pixel that includes:
      a dual conversion gain readout circuit;
      at least one first photodiode;
      a diffusion region having a first capacitance for accommodating a charge of the at least one first photodiode, wherein the dual conversion gain readout circuit reads out the charge of the diffusion region with a first amplification factor and with a second amplification factor; and
      at least one second photodiode, wherein the diffusion region accommodates a charge of the at least one second photodiode, and wherein the dual conversion gain readout circuit reads out the charge of the diffusion region with at least one third amplification factor and at least one fourth amplification factor, and
      wherein the dual conversion gain readout circuit is configured to form the at least one third amplification factor with: (i) the first capacitance, or (ii) the first capacitance and the first photodiode capacitance, and wherein the dual conversion gain readout circuit is configured to form the at least one fourth amplification factor with: (iii) the first capacitance and the second capacitance; or (iv) the first capacitance and the second capacitance and the first photodiode capacitance.

16. A method for reading out a CMOS pixel, the method comprising:
   reading out the charge of at least one first photodiode from a diffusion region with a first amplification factor, wherein the CMOS pixel includes a dual conversion gain readout circuit, the at least one first photodiode; the diffusion region, which has a first capacitance for accommodating a charge of the at least one first photodiode, wherein the dual conversion gain readout circuit reads out the charge of the diffusion region with the aid of a first amplification factor and with a second amplification factor, and at least one second photodiode, wherein the diffusion region accommodates a charge of the at least one second photodiode, and wherein the dual conversion gain readout circuit reads out the charge of the diffusion region with the aid of at least one third amplification factor and at least one fourth amplification factor;

reading out the charge of the at least one first photodiode from the diffusion region with the second amplification factor, resetting the dual conversion gain readout circuit and the first photodiode;

reading out the charge of the at least one second photodiode from the diffusion region with the third amplification factor; and reading out the charge of the at least one second photodiode from the diffusion region with the fourth amplification factor.

17. The method as recited in claim 16, wherein in the step of reading out with the aid of the first amplification factor, the first capacitance is used for the reading out.

18. The method as recited in claim 16, wherein in the step of reading out with the aid of the second amplification factor, the first capacitance and the second capacitance are used for the reading out.

19. The method as recited in claim 16, wherein in the step of reading out with the aid of the third amplification factor, one of the first capacitance or the first capacitance and the first photodiode capacitance are used for the reading out.

20. The method as recited in claim 16, wherein in the step of reading out with the aid of the fourth amplification factor, one of the first capacitance and the second capacitance or the first capacitance and the second capacitance and the first photodiode capacitance are used for the reading out.

* * * * *